(12) United States Patent
Krause et al.

(10) Patent No.: US 6,943,418 B2
(45) Date of Patent: Sep. 13, 2005

(54) INSULATING ELEMENT

(75) Inventors: Elmar Krause, Warstein (DE);
Heinrich Gerstenkoeper, Warstein (DE); Werner Struwe, Warstein (DE)

(73) Assignee: EUPEC Europaeische Gesellschaft fuer Leistungshalbleiter mbH & Co. KG, Warstein-Belecke (DE)

( * ) Notice: Subject to any disclaimer, the term of this patent is extended or adjusted under 35 U.S.C. 154(b) by 229 days.

(21) Appl. No.: 10/372,988

(22) Filed: Feb. 24, 2003

(65) Prior Publication Data

US 2003/0151061 A1 Aug. 14, 2003

Related U.S. Application Data

(63) Continuation of application No. PCT/DE01/02873, filed on Jul. 30, 2001.

(30) Foreign Application Priority Data

Aug. 22, 2000 (DE) .......................................... 100 41 112

(51) Int. Cl.[7] .......................... H01L 29/82; H01L 29/00
(52) U.S. Cl. ...................................... 257/415; 257/522
(58) Field of Search ................................ 257/415, 522

(56) References Cited

U.S. PATENT DOCUMENTS 3,492,545 A    1/1970  Meyerhoff
5,047,836 A    9/1991  Tokunoh
5,436,473 A    7/1995  Passerini et al.
6,472,719 B1 * 10/2002 Lin et al. ..................... 257/522
6,639,289 B1 * 10/2003 Hays .......................... 257/415

FOREIGN PATENT DOCUMENTS

| DE | 40 11 275 C2 | 10/1990 |
| DE | 42 27 063 A1 | 2/1994 |
| DE | 44 43 611 A1 | 7/1995 |
| EP | 0 158 749 A1 | 10/1985 |
| EP | 0 365 007 A2 | 4/1990 |
| EP | 0 669 652 A1 | 8/1995 |
| FR | 2 004 192 | 11/1969 |
| JP | 61134064 | 6/1986 |

* cited by examiner

Primary Examiner—Ngân V. Ngô
(74) Attorney, Agent, or Firm—Laurence A. Greenberg; Werner H. Stemer; Gregory L. Mayback

(57) ABSTRACT

An insulating element insulates a contact area of an electronic component from other contact areas of the component. In order to ensure an assembly that is as trouble-free as possible as well as a trouble-free operation, the insulation element has at least on a first section, which is accommodated inside a contact recess of a contact during operation, is provided with an outer contour that enables an accommodation with the utmost smallest amount of play inside the contact recess.

12 Claims, 4 Drawing Sheets

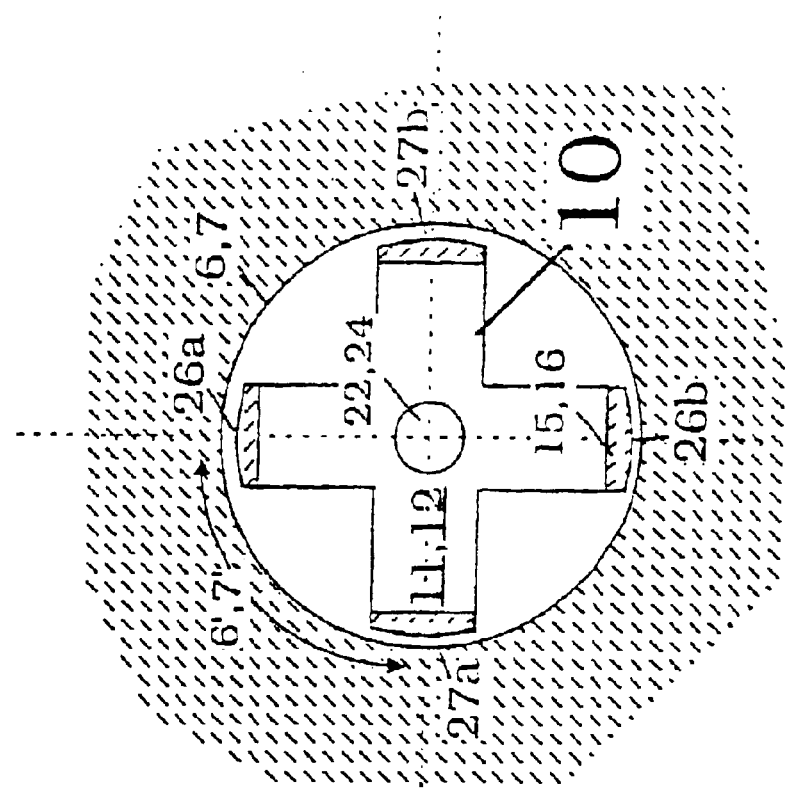
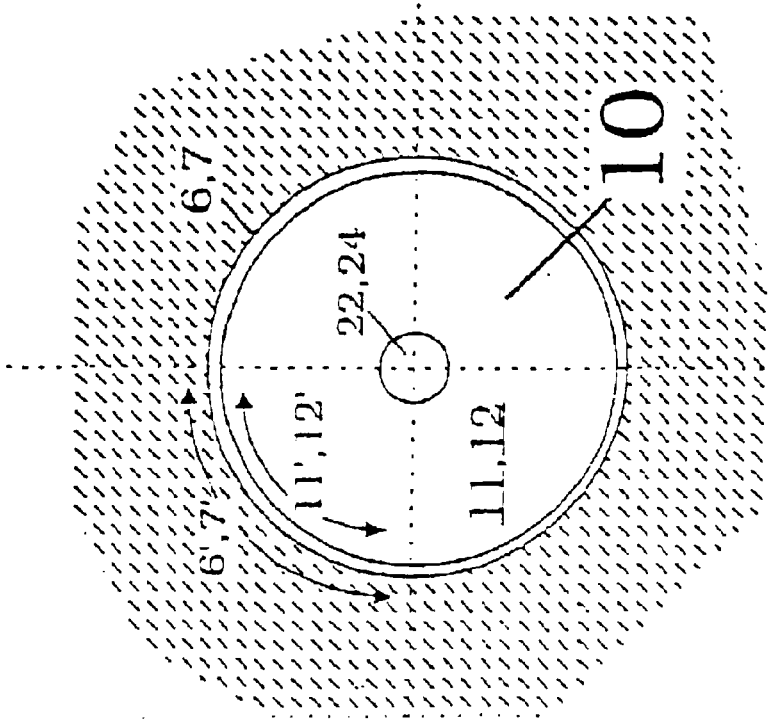
Fig. 2A
Fig. 2B

INSULATING ELEMENT

CROSS-REFERENCE TO RELATED APPLICATION

This application is a continuation of copending International Application No. PCT/DE01/02873, filed Jul. 30, 2001, which designated the United States and was not published in English.

BACKGROUND OF THE INVENTION

Field of the Invention

The invention relates to an insulating element for electrically insulating a first contact region of an electronic component, in particular a power semiconductor element or the like, from at least one second contact region of the component and/or from a contact which makes contact with the second contact region during operation. The insulating element has at least one first section that is configured to be accommodated essentially in a contact recess of the contact during operation. The fist section has an outer contour that approximately corresponds, at least in regions, to an inner contour of the contact recess of the contact in such a way that, during operation, the first section can be accommodated in the contact recess of the contact with at most a low degree of play.

In the construction and mounting of circuit configurations having a multiplicity of electronic components, what is generally of crucial importance is complying with the positioning of the electronic components with respect to one another and correctly and reliably contact-connecting electronic components to one another and to the outside world.

With regard to the problems that currently occur in power semiconductor electronics in the context of alternating thermal loads, the so-called pressure contact technique has been developed, in which the power semiconductor components or the like are retained on a substrate, accommodating the electronic components, by spring-prestressed pressure contacts or the like. In this case, the production and maintenance of a mechanical and hence electrical contact between a contact region of an electronic component and a contact carrying the current are also effected essentially by the mechanically applied forces. This has the advantage that, by a corresponding setting of the mechanical forces—for example by tensioning devices or by spring devices—it is possible to take account sufficiently of the alternating thermal loads owing to the mechanical tolerances associated with the mechanical fixing.

However, the releasable contact connection of the electronic components by chemical pressure forces entails a certain tolerance with regard to the positionability of the electronic components on the substrate that carries the circuit. In order that, in particular, electronic components of multipart construction—for example containing the actual electronic component, the contacts and insulating elements—can be positioned sufficiently accurately, so-called positioning aids or centering aids have been used heretofore in the construction of the circuit configuration. However, the use of centering aids of this type results in an additional outlay in respect to manufacturing and hence an increase in costs.

SUMMARY OF THE INVENTION

It is accordingly an object of the invention to provide an insulating element that overcomes the above-mentioned disadvantages of the prior art devices of this general type, which can be positioned and mounted on the corresponding electronic component in a particularly simple yet reliable manner.

With the foregoing and other objects in view there is provided, in accordance with the invention, an insulating element for electrically insulating a first contact region of an electronic component from at least one second contact region of the electronic component and/or from a contact making contact with the second contact region during operation. The contact has a contact recess formed therein and the electronic component has a further contact recess formed therein and the first contact region is disposed in the further contact recess. The insulation element contains at least one first section to be accommodated in the contact recess of the contact during operation. The first section has an outer contour approximately corresponding, at least in regions, to an inner contour of the contact recess of the contact such that, during operation, the first section is accommodated in the contact recess of the contact with at most a low degree of play. The insulation element further contains a second section disposed opposite the first section and configured such that the second section can be accomodated in the further contact recess during operation. The second section has an outer contour approximately corresponding, at least in regions, to an inner contour of the further contact recess such that, during operation, the second section is accommodated in the further contact recess with at most a low degree of play.

Insulating elements of the generic type for electronic components are configured to ensure, during operation, that the electrical insulation of the first contact region of the electronic component, in particular a power semiconductor component or the like, is insulated from at least one second contact region of the component and/or form a contact which makes contact with the second contact region during operation.

The insulating element has at least one first section, which is configured to be accommodated substantially in the contact recess of the contact during operation.

The solution according to the invention provides for the first section of the insulating element to have an outer contour which approximately corresponds, at least in regions, to an inner contour of the contact recess of the contact in such a way that, during operation, the first section can be accommodated in the contact recess of the contact with at most a low degree of play.

This measure ensures that, on account of the limited mobility of the insulating element, a movement or slipping during or after mounting to a great extent does not happen, so that a position or setting of the insulating element with respect to the electronic component, once chosen and identified as correct, is maintained to the greatest possible extent and a movement and hence a tilting of the insulating element on the electronic component is avoided even during operation.

Additional auxiliary measures such as, for example, centering aids or positioning aids that orient and hold the insulating element during mounting with respect to the electronic component are obsolete in this case. Viewed overall, reliable mounting and reliable operation thus result while preserving the desired insulation, to be precise inherently avoiding additional mounting devices to the greatest possible extent.

In this case, a fundamental idea of the present invention consists in that the outer contour of the first section—to be inserted into the contact recess—is configured at least partly in such a way that it approximately corresponds to the inner contour of the contact recess at least in regions in such a way as to ensure, during operation, at most a low degree of mobility of the insulating element with respect to the electronic component or the contact, that is to say a low degree of mobility of the inserted first section of the insulating element in the contact recess. The fact that a low degree of play is nevertheless present is advantageous with regard to compensating for the alternating thermal loads.

In one preferred embodiment, the insulating element is configured for electrically insulating the first contact region formed substantially in the contact recess. To that end, the insulating element according to the invention has a second section, which is opposite the first section and which is configured in such a way that it can be accommodated in the contact recess of the first contact region during operation. What is achieved by this measure is that the insulating element can be used in the case of contact regions that are formed in recesses of the electronic component. This applies, for example, to specific power transistors or to IGBTs, whose gate contacts are often formed in a manner concealed in recesses in the device and yet additionally have to be connected up and simultaneously insulated from other contact regions and contacts of the electronic component.

In a further preferred embodiment of the insulating element according to the invention, it is provided that the second section of the insulating element has an outer contour which approximately corresponds, at least in regions, to an inner contour of the contact recess of the first contact region in such a way that, during operation, the second section can be accommodated in the contact recess of the first contact region with at most a low degree of play. What is achieved by this measure, as in the case of the first section of the insulating element, is that the mobility of the second section in the contact recess of the first contact region of the electronic component is restricted to the greatest possible extent. This additionally ensures the continuance of a position of the insulating element—once the position has been chosen and identified as correct—with respect to the contact region specifically and with respect to the electronic component overall. In this case, the respective mechanical dimensionings and hence the setting of the play of the two sections in the contact recesses must be coordinated with one another.

The setting of the at most low degree of play of the first and/or of the second section with respect to the respective contact recesses is effected in a suitable manner particularly simply by virtue of the fact that, in accordance with a further embodiment of the insulating element according to the invention, the first and/or the second section of the insulating element have at least one mating region, in particular in the region of their outer contours, which are configured to make mechanical contact at least partly, during operation, in the event of the first and, respectively, the second section being accommodated in the recesses, with the inner contours thereof in order to form a form-locking connection at least in regions. By the form-locking connection, the side regions of the sections of the insulating element are practically supported against the side regions, that is to say the inner contours, of the contact recesses.

In this case, it is further preferred for the mating regions to have an elastically and/or plastically deformable material or to be formed from such a material. This is because then not only is a particularly intimate mechanical contact produced, but also, in addition, a certain mechanical residual mobility, which benefits the positionability of the insulating element with respect to the electronic component and also the compensation of the alternating thermal loads.

As a further measure it is advantageous that, in the region of the mating regions, the outer contours of the first and/or of the second section, in the state not accommodated in the recesses, have, at least in regions, a larger diameter than the inner contours of the respective contact recesses. What is thereby achieved is that the respective sections of the insulating element can be inserted into the contact recesses in the manner of a stopper or plug, thereby producing a particularly reliable mechanical fixing of the insulating element with respect to the contacts and with respect to the electronic component.

It is advantageous, precisely with regard to the so-called pressure contact connection of the electronic components on the circuit substrate, in the first section of the insulating element, an offset is formed in the region of the outer contour. Furthermore, it is then advantageous that the offset has a larger diameter than the outer contour of the second section of the insulating element, in such a way that a shoulder is formed in the transition region toward the second section, on which shoulder the insulating element can be supported during operation on the electronic device. What is thereby achieved is that a mechanically tensioned contact, in whose contact recess the first section of the insulating element is accommodated, presses the insulating element against the electronic component and the latter is then pressed against the circuit substrate, the force or the pressure of the mechanical mechanism being supported via the offset and the shoulder thereof on the device and then being transmitted to the circuit substrate.

It is advantageously provided that the first section and/or the second section are disposed between a first and a second end region of the insulating element. By way of example, the end regions may also be in part essentially planar end faces in order to be supported in the recesses in the manner of a stop during operation. In an advantageous manner, however, the end regions are formed as threading-in regions that run conically at least in regions and serve for the essentially self-centering insertion of the first and/or second section into the contact recesses.

In terms of production technology, a particularly simple insulating element is obtained if the insulating element is formed essentially in one part and/or in one piece. Particularly advantageous materials for the insulating element according to the invention are ceramic materials, $Al_2O_3$ or the like.

It goes without saying that, with respect to its function, the insulating element according to the invention does not only have insulating tasks. Rather, a recess, in particular running centrally, is provided in the insulating element, through which recess, during operation, a contact can be led to the first contact region while preserving the other insulation. This may be e.g. the gate contact of an IGBT.

The invention enables the arrangement and positioning, in particular the centering, of electronic components, in particular of diodes, thyristors, IGBTs and the like, with regard to specific contacts—for example anode or cathode current contacts—in a circuit module. This is done without providing additional positioning or centering aids. A tilting of the insulating elements with respect to the contact recesses in the electronic component or in the contacts is avoided, which lowers the probability of the occurrence of operating faults, for example ignition failures or the like.

At the same time, the insulating element has the task of accommodating one contact in an insulating manner with respect to other contacts of the electronic component and, by way of its mechanical stability, of taking up and transmitting the contact force of a press-on mechanism, namely of the tensioned contact and/or of a tensioning spring provided therein.

What is achieved by the configuration of the insulating element according to the invention with an outer offset and a corresponding shoulder is that an insulating element introduced into the device, for example a thyristor, during the construction of the entire circuit configuration, engages in a contact recess of the contact when the contact is introduced into the module forming the circuit configuration. As a result, the device, for example the thyristor or the like, is positioned, namely centered, and is in the correct position with respect to the contact which feeds in or carries away the electric current.

The new insulating element according to the invention obviates the centering aids and positioning aids that are otherwise necessary in addition. The offset with its shoulder provided on the insulating element simultaneously serves as a guiding aid in addition to the section or stem that is situated in the contact recess of the electronic device, for example the thyristor. An inclination or tilting of the insulating element relative to the electronic component, on the one hand, and relative to the external contact, on the other hand, is therefore precluded to the greatest possible extent.

The inventive concept consists in giving the insulating element a corresponding form with regard to its outer contour, such that a play in the event of accommodation in the contact recesses is avoided to the greatest possible extent. This is done inherently such that an inclination or tilting is avoided and, consequently, the operation of the corresponding contacts is more reliable. The contact resistances associated with the centering aids that are conventionally used are also obviated.

Other features which are considered as characteristic for the invention are set forth in the appended claims.

Although the invention is illustrated and described herein as embodied in an insulating element, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 2A and 2B are partial sectional plan views of the configuration of the insulating element according to the invention in operation;

DESCRIPTION OF THE PREFERRED EMBODIMENTS

Figure 1:
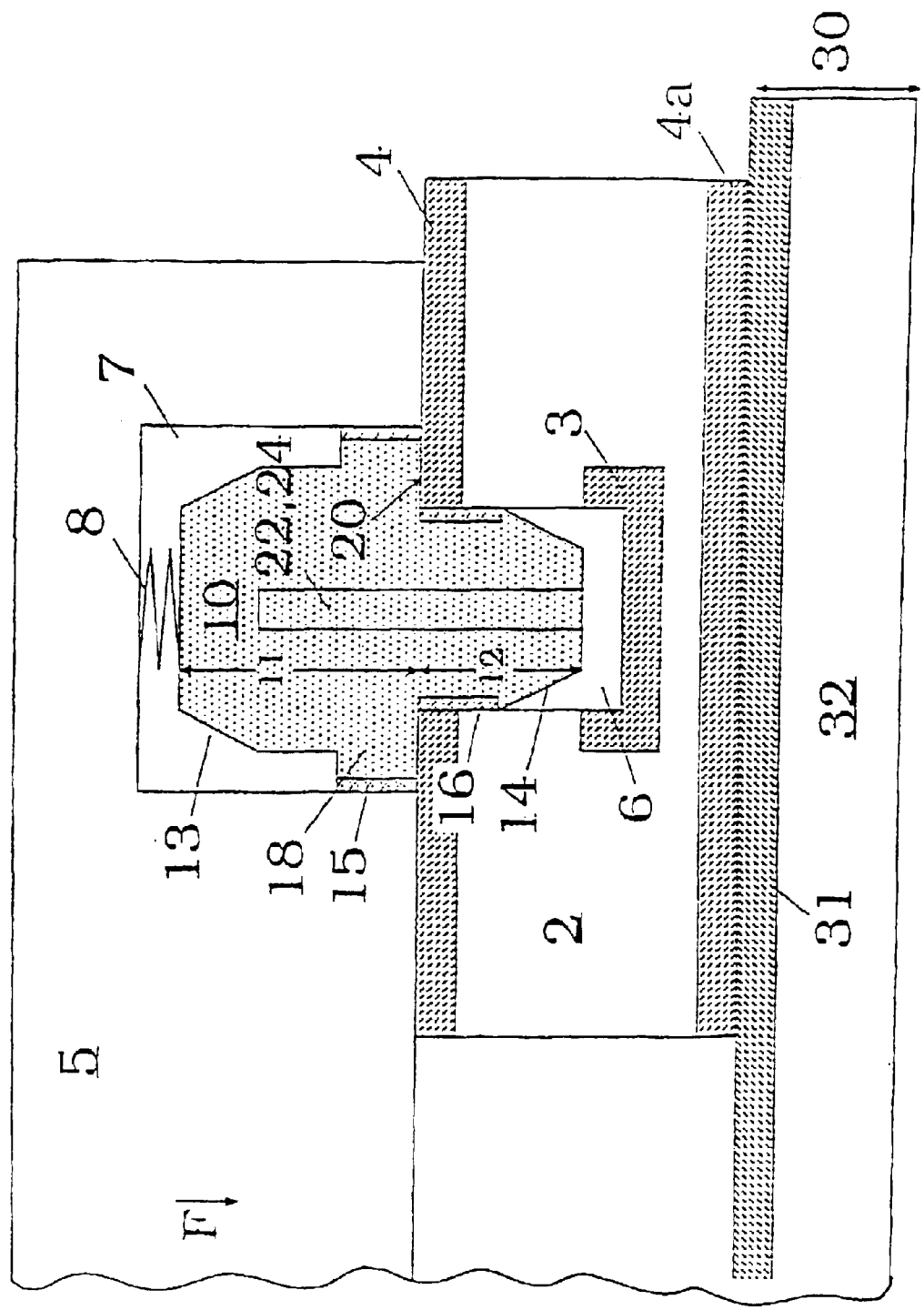
FIG. 1 is a diagrammatic, partial sectional side view of a configuration of an insulating element according to the invention in operation.

Referring now to the figures of the drawing in detail and first, particularly, to FIG. 1 thereof, there is shown, in the form of a partially sectional side view, a first exemplary embodiment of an insulating element 10, according to the invention in operation.

Disposed on a circuit substrate 30 containing a conductive layer 31 and a carrier substrate 32, is an electronic component 2, here in the form of an IGBT, with contact regions 3, 4 and 4a. The electronic component 2 by a mechanical pressure force F exerted from above on the device 2 by the mechanically tensioned contact 5, is contact-connected to the contact region 4 in operation, in order to contact-connect the device 2 on the circuit substrate 30 by pressure contact. The contact regions 4 and 4a of the electronic component 2 are formed at the upper surface thereof and at the lower surface thereof, respectively. A further contact region 3, for example a gate contact, is formed in a contact recess 6 of the electronic component 2. The contact region 3 is externally contact-connected with a gate contact 24 during operation. In order to electrically insulate the contact region 3 and the contact 24 connected thereto from the other contact regions 4 and 4a and also from the external contact 5, an insulating element 10 is provided, which has the gate contact 24 running in its central recess 22.

The insulating element 10 has a first section 11 and a second section 12. The second section 12 of the insulating element 10 is accommodated in the contact recess 6 of the contact region 3 essentially in a form-locking manner, at most a low degree of play being permitted. A form-locking connection is one that connects two elements together due to the shape of the elements themselves, as opposed to a force-locking connection, which locks the elements together by force external to the elements.

The first section 11 is accommodated in a contact recess 7 of the contact 5. The first section 11 has an outer contour 11' that nestles mechanically against an inner contour 7' of the contact recess 7 in regions. This is realized by the first section 11 of the insulating element 10 having an offset 18 whose external diameter essentially corresponds to the internal diameter of the contact recess 7, a mating region 15 being formed in the direct end region of the offset 18 in contact with the inner contour 7' of the contact recess 7, the mating region 15 being in direct mechanical contact with the inner contour 7' of the contact recess 7.

The mating region 15 restricts the mobility of the insulating element 10 to the greatest possible extent, in particular in the lateral direction, so that a tilting cannot occur either during mounting or during operation.

Running within the insulating element 10 there is the recess 22, which is formed approximately centrally and in which the gate contact 24 toward the contact region 3 of the electronic component 2 is accommodated and led toward the outside.

End regions 13 and 14 are also discernible, which terminate the insulating element 10 toward the top and toward the bottom. The end regions 13 and 14 have planar end faces and also conically formed side faces for threading the first and second sections 11 and 12 into the contact recesses 6 and 7 in a self-centering manner.

By the pressure force F and spring elements 8 formed at the base area of the contact recess 7, a pressure force is also exerted on the insulating element 10, the pressure force being transmitted via the support of the offset 18 by a shoulder 20 to the electronic component 2 and on to the circuit substrate 30.

FIGS. 2A and 2B show, in a sectional plan view, two embodiments for the first section 11 and the second section 12 of the insulating element 10 according to the invention in interaction with the contact recesses 6 and 7.

The first and second sections 11, 12 are accommodated in the contact recesses 6, 7 of the contact region 3 and of the contact 5, respectively.

In the embodiment of FIG. 2A, the outer contour 11', 12' of the first/second section 11, 12 approximately corresponds to the inner contour 6', 7' of the contact recess 6, 7, to be precise in a circumferential direction. Although here the cross-sectional form is based on a circular area, other base area forms are also conceivable. This is shown in FIG. 2B, for example, where in each case two regions 26a, 26b and 27a, 27b that are opposite one another in pairs are supported on the inner contour 6', 7' of the contact recesses 6, 7.

Figure 3A:
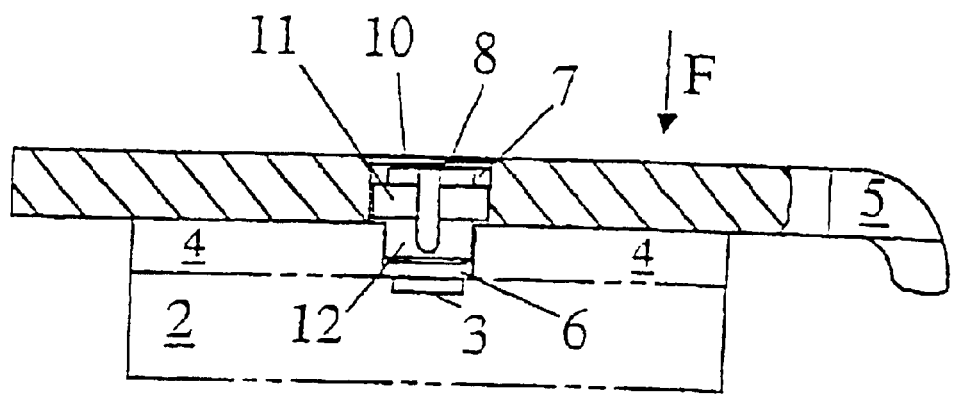
FIGS. 3A and 3B are partial sectional views of a further embodiment of the insulating element according to the invention in operation.
Figure 3B:
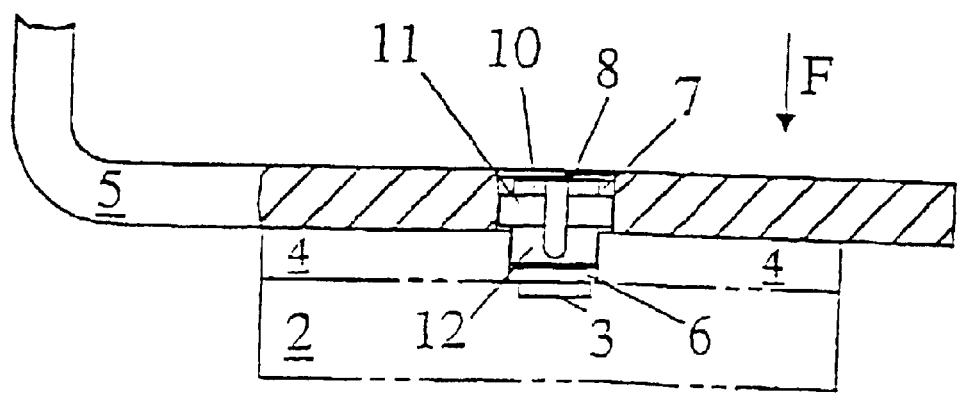

FIGS. 3A and 3B illustrate, in partially sectional side views, a further embodiment of the insulating element 10 according to the invention in operation. In this illustration, the first and second sections 11 and 12, respectively, of the insulating element 10 mate mechanically with inner contours 6', 7' of the contact recesses 6, 7, as a result of which once again a mechanical play of the insulating element 10 in the recesses 6, 7 is avoided to the greatest possible extent, in order to ensure a lasting insulation without any interruption of the required contacts during mounting and during operation.

Figure 4A:
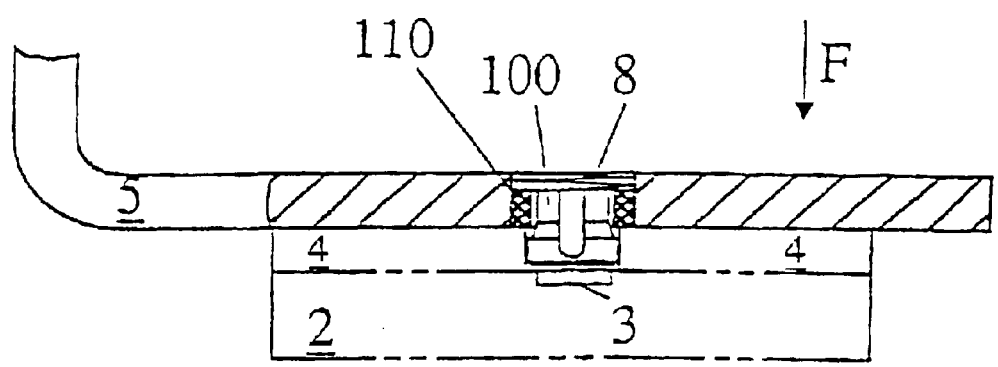
FIGS. 4A and 4B are partial sectional side views of two conventional insulating elements in operation.
Figure 4B:
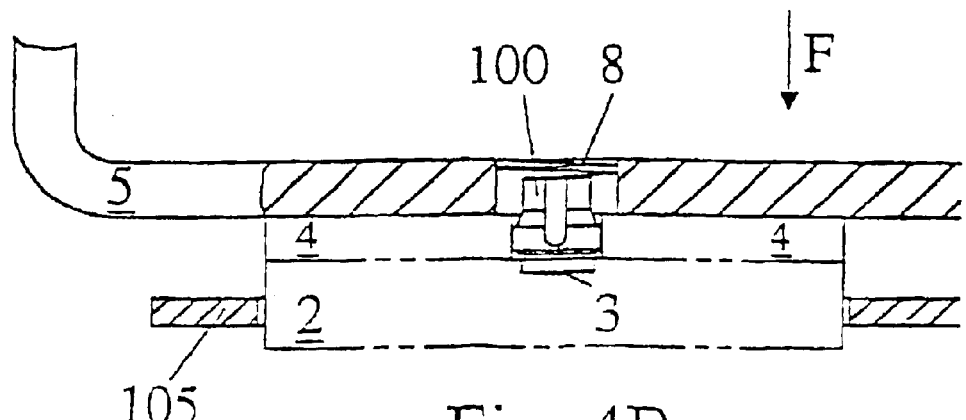

FIGS. 4A and 4B show, in partially sectional side view, conventional insulating elements 100 in operation. It can be seen from these illustrations that at least the first section 11 of the conventional insulating element 100 is accommodated in a spatially relatively generous manner in the corresponding contact recess 7 of the contact 5, thereby producing, in principle, a high degree of mobility of the insulating element 100 in the contact recess 7.

In order to prevent the mobility that is possible in principle, and thus the probability of tilting or incorrect positioning, in the case of the embodiment of FIG. 4B, a so-called centering plate 105 is formed, which retains the electronic device 2 on the circuit substrate, thereby avoiding a relative movement between the device 2 and the contact 5.

In the case of the embodiment of FIG. 4A, by contrast, the interspaces between the first section 11 of the conventional insulating element 100 and the inner contour 7' of the contact recess 7 are mechanically filled by an insulating centering ring 110. Both the centering ring 110 and the centering plate 105 constitute additional measures—which increase the complexity and the costs—for avoiding a tilting of the conventional insulating element 100 and for ensuring the maintenance of—once chosen—positioning and centering, which are precisely avoided according to the invention.

We claim:

1. An insulating element for electrically insulating a first contact region of an electronic component from at least one second contact region of the electronic component and/or from a contact making contact with the second contact region during operation, the contact having a contact recess formed therein and the electronic component having a further contact recess formed therein and the first contact region disposed in the further contact recess, the insulation element comprising:

at least one first section to be accommodated in the contact recess of the contact during operation, said first section having an outer contour approximately corresponding, at least in regions, to an inner contour of the contact recess of the contact such that, during operation, said first section being accommodated in the contact recess of the contact with at most a low degree of play; and a second section disposed opposite said first section and configured such that said second section can be accommodated in the further contact recess during operation, said second section having an outer contour approximately corresponding, at least in regions, to an inner contour of the further contact recess such that, during operation, said second section being accommodated in the further contact recess with at most a low degree of play.

2. The insulating element according to claim 1, wherein at least one of said first section and said second section has at least one mating region configured for making mechanical contact at least partly, during operation, in an event of said first section and, respectively, said second section being accommodated in the contact recess and the further contact recess, respectively with the inner contour thereof for forming a form-locking connection at least in regions.

3. The insulating element according to claim 2, wherein said mating region is formed from at least one material selected from the group consisting of elastically deformable materials and plastically deformable materials.

4. The insulating element according to claim 2, wherein in a region of said mating region, said outer contour of at least one of said first section and said second section, in a state not accommodated in the contact recess or the further contact recess, has, at least in regions, a larger diameter than the inner contour of the contact recess or the further contact recess, respectively.

5. The insulating element according to claim 1, wherein said first section has an offset formed in a region of said outer contour, said offset having a larger diameter than said outer contour of said second section such that a shoulder is formed in a transition region toward said second section, and on said shoulder the insulating element is supported during operation on the electronic device.

6. The insulating element according to claim 1, further comprising:

end regions, including a first end region and a second end region, at least one of said first section and said second section is disposed between said first and second end regions.

7. The insulating element according to claim 6, wherein said end regions are formed as threading-in regions that run conically at least in regions and serve for assisting in self-centering insertion of at least one of said first section and said second section into the contact recess and the further contact recess, respectively.

8. The insulating element according to claim 1, wherein said first section and said second section are formed as a one-piece unit from a material selected from the group consisting of ceramic materials and $Al_2O_3$.

9. The insulating element according to claim 1, wherein said first section and said second section have a recess formed therein, and through said recess, during operation, a contact can be led to the first contact region while preserving an insulated state with other contacts.

10. The insulating element according to claim 1, wherein the electronic component is a power semiconductor element.

11. The insulating element according to claim 2, wherein said mating region is disposed at and defines part of said outer contour.

12. The insulating element according to claim 9, wherein said recess of said first and second sections runs centrally therein.

* * * * *